(12) United States Patent
Hamamoto et al.

(10) Patent No.: US 8,058,712 B2
(45) Date of Patent: Nov. 15, 2011

(54) DEVICE HAVING WIRE BOND AND REDISTRIBUTION LAYER

(75) Inventors: Mitchell M. Hamamoto, San Jose, CA (US); Yi Gao Chen, Jiangsu (CN); Kim Hwee Tan, Jiangsu (CN)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/861,744

(22) Filed: Aug. 23, 2010

(65) Prior Publication Data

US 2011/0204495 A1   Aug. 25, 2011

(51) Int. Cl.
*H01L 23/552*   (2006.01)

(52) U.S. Cl. .................. 257/659; 257/E23.114

(58) Field of Classification Search .......... 257/659, 257/E23.114
See application file for complete search history.

(56) References Cited

U.S. PATENT DOCUMENTS

| 5,747,870 | A | 5/1998 | Pedder |
| 6,180,445 | B1 | 1/2001 | Tsai |
| 6,355,535 | B2 | 3/2002 | Liou |
| 6,511,901 | B1 | 1/2003 | Lam et al. |
| 6,586,273 | B2 | 7/2003 | Aiba et al. |
| 6,636,139 | B2 | 10/2003 | Tsai et al. |
| 6,674,174 | B2 | 1/2004 | Chungpaiboonpatana et al. |
| 6,800,930 | B2 | 10/2004 | Jackson et al. |
| 7,436,683 | B2 | 10/2008 | Shen |
| 2007/0275503 | A1 | 11/2007 | Lin et al. |

*Primary Examiner* — David Zarneke

(74) *Attorney, Agent, or Firm* — Pillsbury Winthrop Shaw Pittman LLP

(57) ABSTRACT

A semiconductor device comprises a copper redistribution line, a copper inductor and aluminum wire bond pads and the integration of the resulting device with an integrated circuit on a single chip, resulting in the decreased size of the chip.

4 Claims, 16 Drawing Sheets

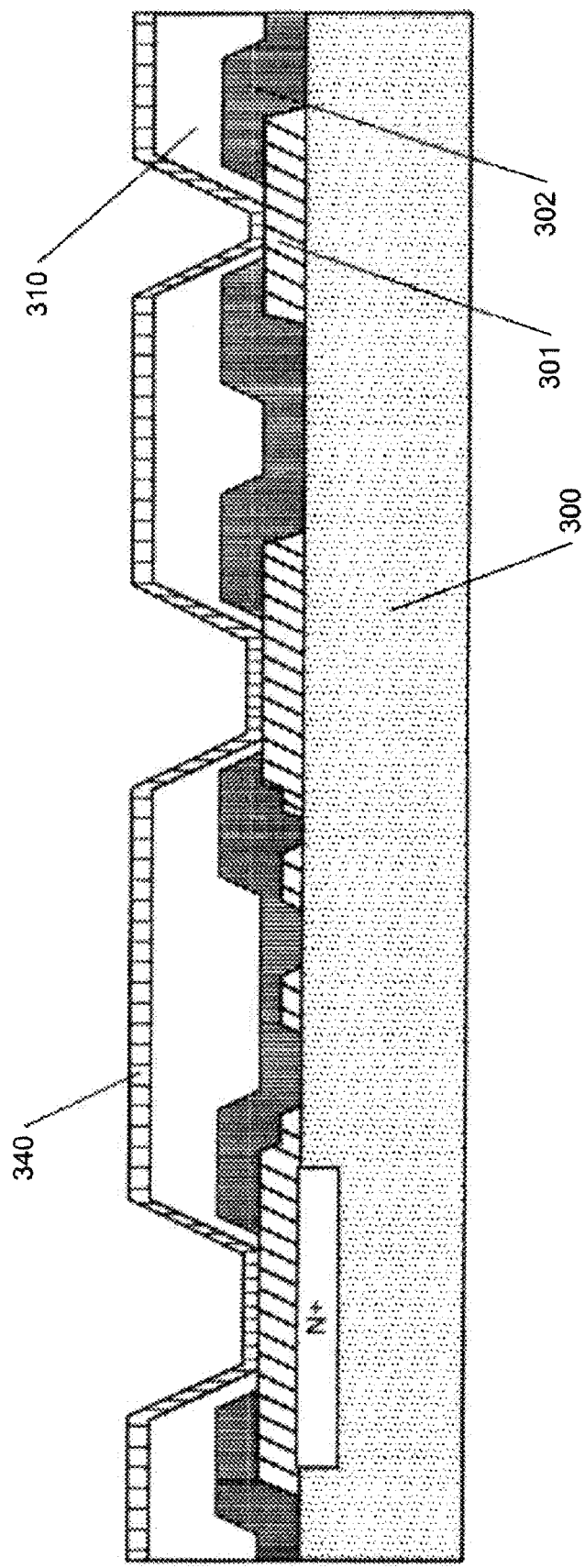

DEVICE HAVING WIRE BOND AND REDISTRIBUTION LAYER

CROSS-REFERENCE TO RELATED APPLICATIONS

This application is a continuation application of U.S. patent application Ser. No. 12/476,847, filed Jun. 2, 2009 (U.S. Pat. No. 7,781,870), which was a division of U.S. patent application Ser. No. 11/352,418, filed Feb. 10, 2006 (U.S. Pat. No. 7,541,251), which applications are incorporated herein by reference for all purposes.

BACKGROUND OF THE INVENTION

Field of the Invention

The present invention relates generally to semiconductor devices, more specifically to the manufacturing method of a semiconductor device with metal redistribution layers and wire bond pads.

Background of the Invention

Many different processes that include the usage of redistribution layers and wire bond pads are in the literature and patents, including Aiba (U.S. Pat. No. 6,586,273), Tsai (U.S. Pat. No. 6,180,445), Lam (U.S. Pat. No. 6,511,901), Jackson (U.S. Pat. No. 6,800,930) and Chungpaiboonpatana (U.S. Pat. No. 6,674,174). Irrespective of these known processes, further improvements are needed particularly with respect to chips that are used in mobile devices which require significant ESD protection as well as the ability to pass signals at high frequencies. Further, these devices must consume very little space. Also, since these semiconductor devices are incorporated into products that are sold to consumers, the manufacturing cost of the component must be minimal.

Specifically, in the mobile device industry, wire bond packaged products are needed that consistently meet exacting application requirements while significantly lowering total solution implementation cost. There is a need for better design and assembly technologies to develop these products in order to increase functionality while decreasing the size of the product.

SUMMARY OF THE INVENTION

One way of increasing the efficiency of a semiconductor device is to decrease the packaging size of the chip. One feature of this invention provides for process technology which allows for the integration of inductors with the integrated circuit on a single die, resulting in the overall decreased size of the chip.

Performance of the resulting device will also be better since the integrated circuit is near the die which is the source of action or execution. In addition, the SMT manufacturing will be easier as less passive devices are assembled onto the board. The cost of the SMT manufacturing process can also assist in decreasing the size of the mother board.

Another feature of this invention is that the use of aluminum for the wire bond pads results in a simpler manufacturing process and lowers the cost of manufacturing. Aluminum is a standard assembly feature and requires no special handling. Thus, the use of aluminum wire bonds results in a simpler manufacturing process. In addition, the use of aluminum wire bond pads instead of copper wire bond pads lowers the cost of manufacturing.

The use of aluminum wire bond pads instead of copper wire bond pads also results in the prevention of deterioration of the resulting device. Aluminum does not oxide as quickly as copper. Thus, the use of aluminum wire bond pads prevents the deterioration and oxidation of the wire bond pads.

In mobile devices, this invention has several additional features. One feature is that the device can provide ESD protection in the range of +/−15 kilo electron volt (IEC) to +/−30 kilo electron volt (HBM). Another feature of this device is that it can provide filtering in the range of 3 gigahertz to 10 gigahertz.

DETAILED DESCRIPTION OF PREFERRED EMBODIMENTS

Embodiments of the present invention will now be described in detail with reference to the drawings, which are provided as illustrative examples so as to enable those skilled in the art to practice the invention. Notably, the figures and examples below are not meant to limit the scope of the present invention. Wherever convenient, the same reference numbers will be used throughout the drawings to refer to same or like parts. Where certain elements of these embodiments can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
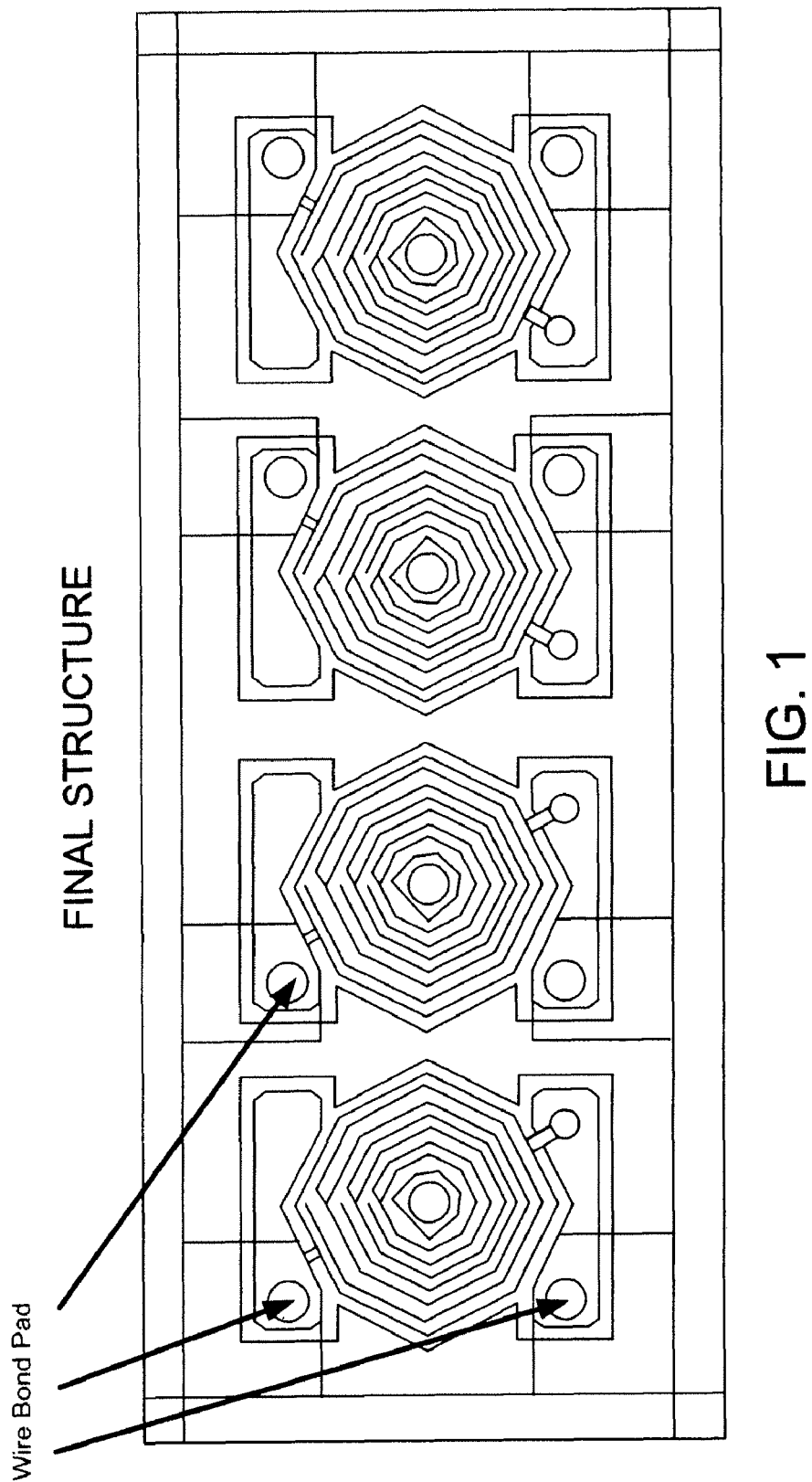
FIG. 1 is a top view of the final structure of the invention.
Figure 2:
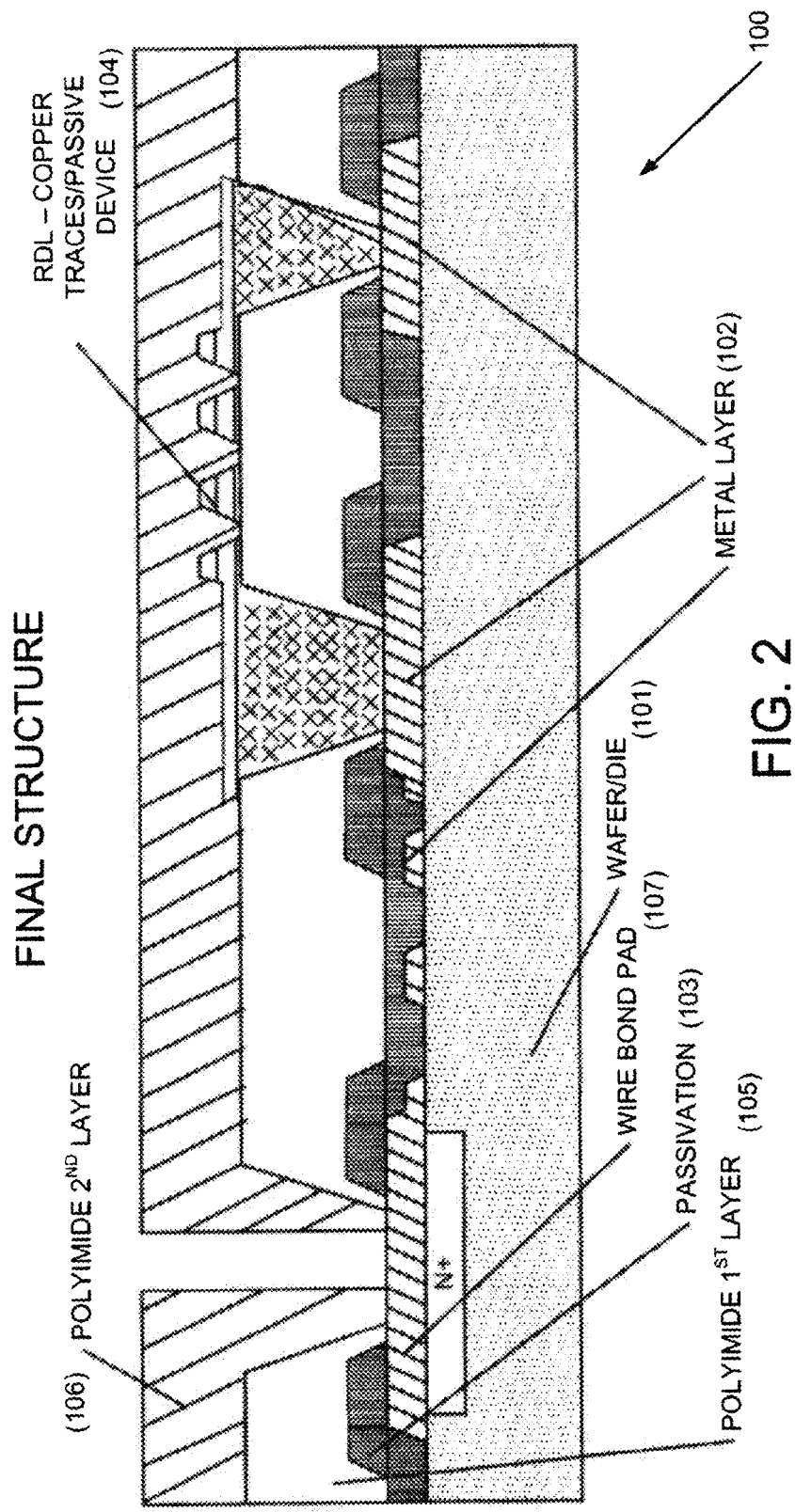
FIG. 2 is a cross sectional view of an embodiment of the invention, showing the aluminum wire bond pad openings, the redistribution layer which typically contains copper, and inductors which are also composed of copper.

FIG. 1 shows a top view of the final structure of an embodiment of the invention. In this embodiment, the structure shows four inductors [50] and multiple wire bond pads [51]. With different embodiments the number and size of the inductors will vary according to design and application FIG. 2 shows a cross-sectional view of one embodiment of the invention. In this embodiment, the semiconductor device [100] consists of an underlying silicon substrate layer [101]. The substrate may contain a plurality of devices, some which are electrically connected. The substrate may also contain ESD protection devices which provide ESD protection in the range of +/−15 kilo electron volt (IEC) to +/−30 kilo electron volt (HBM) and filtering devices which can provide filtering in the range of 3 gigahertz to 10 gigahertz. On top of the substrate layer is an aluminum metal layer [102], a passivation layer [103], a copper redistribution layer [104], a first polyimide layer [105] and a second polyimide layer [106]. The aluminum layer [102] directly contacts the redistribution layer (RDL) [104] through openings in the first polyimide layer [105], and the passivation layer [103]. Additionally, there is an opening through the first polyimide layer, the second polyimide layer, and the passivation layer to expose the aluminum metal layer. This opening forms an external wire bond pad opening [107].

Figure 3A:
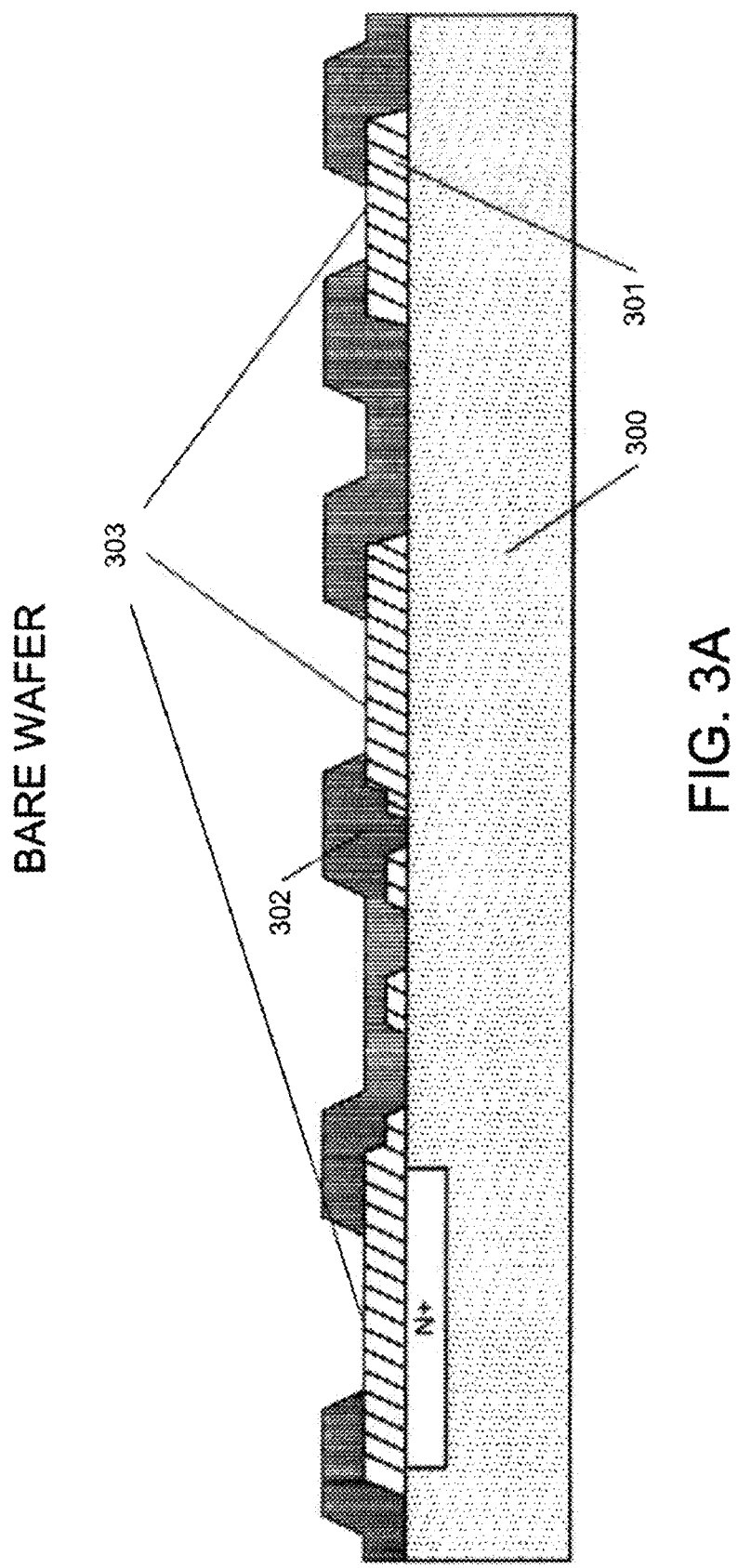
FIGS. 3A-3N shows the process steps for producing the wire bond pad openings, redistribution layer and inductors in accordance with a certain embodiment of the invention.
Figure 3B:
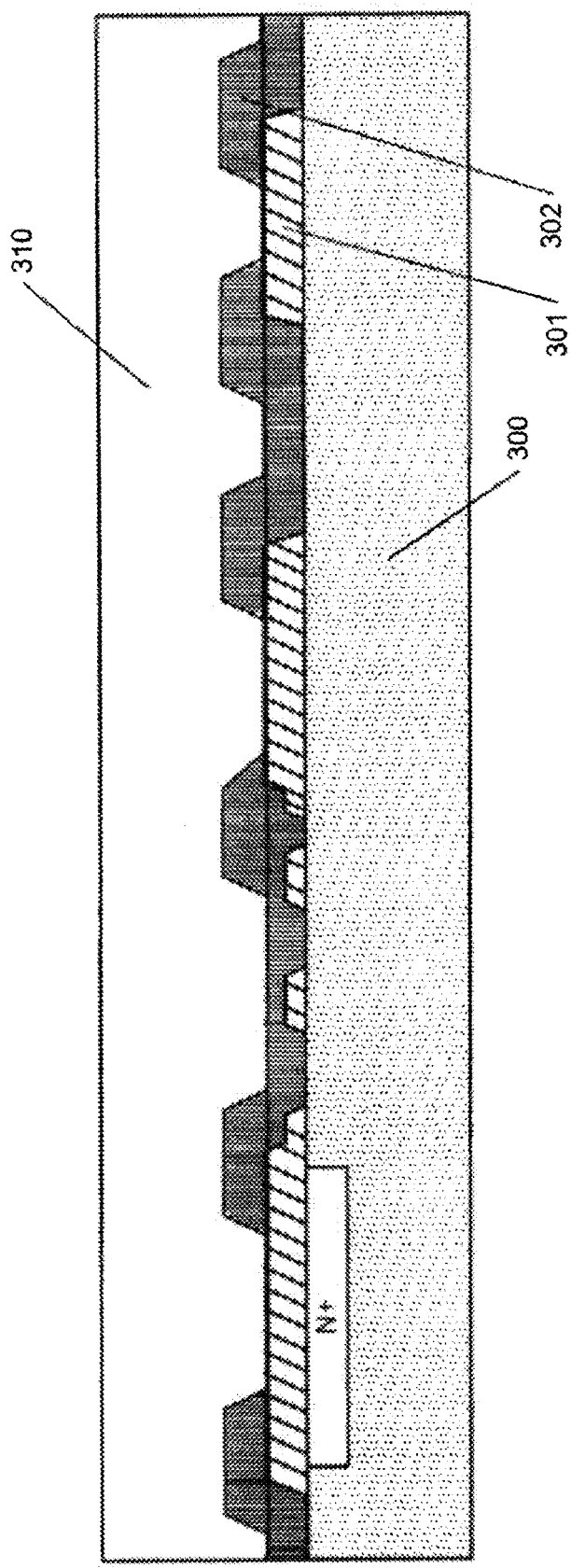
Figure 3C:
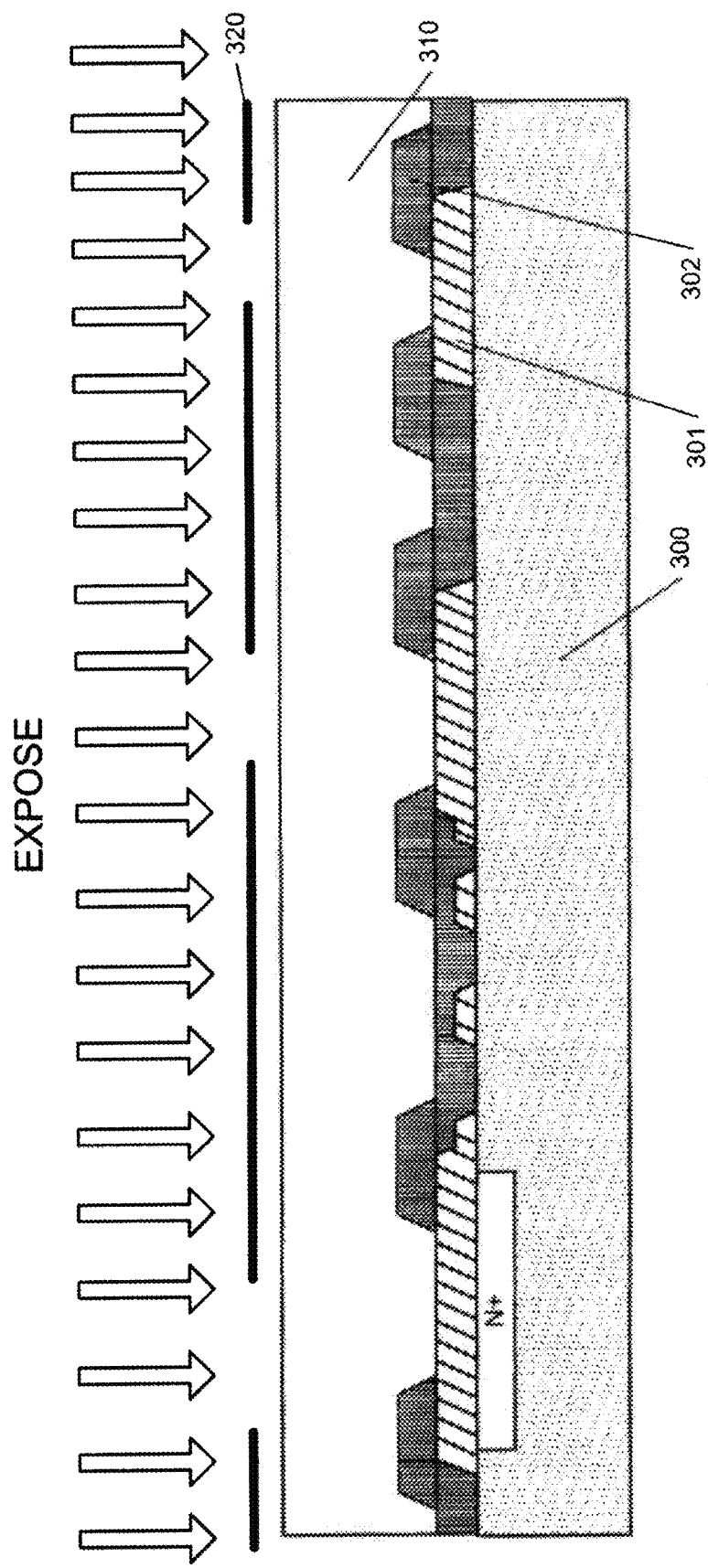
Figure 3D:
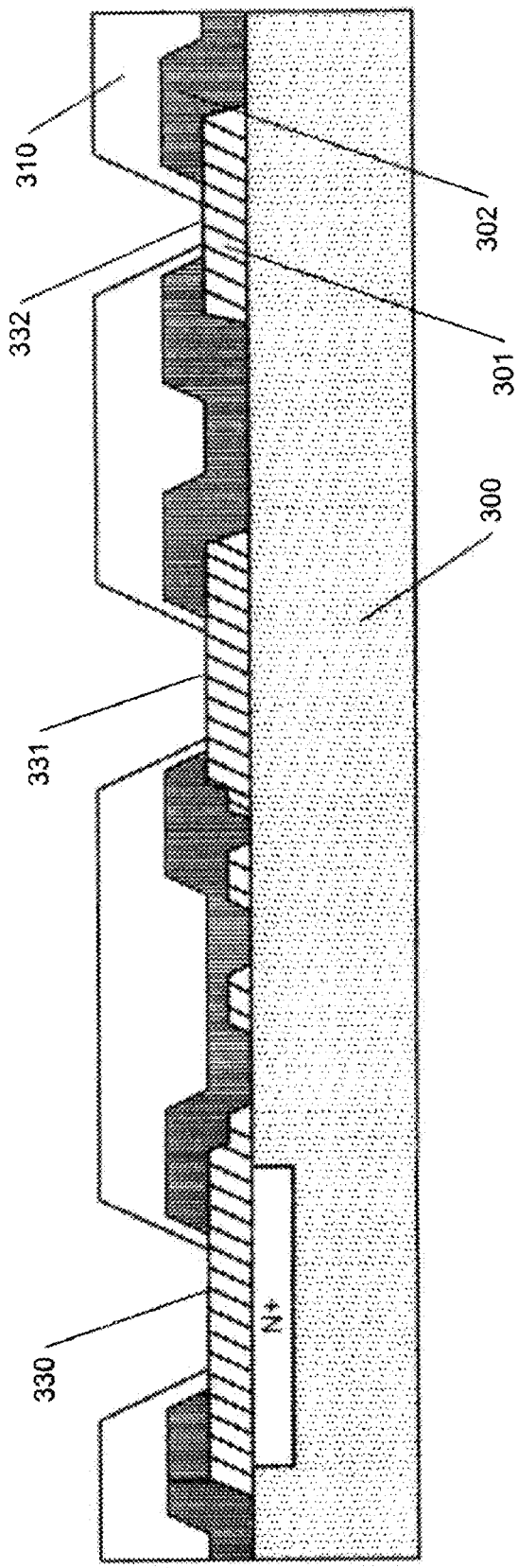
Figure 3F:
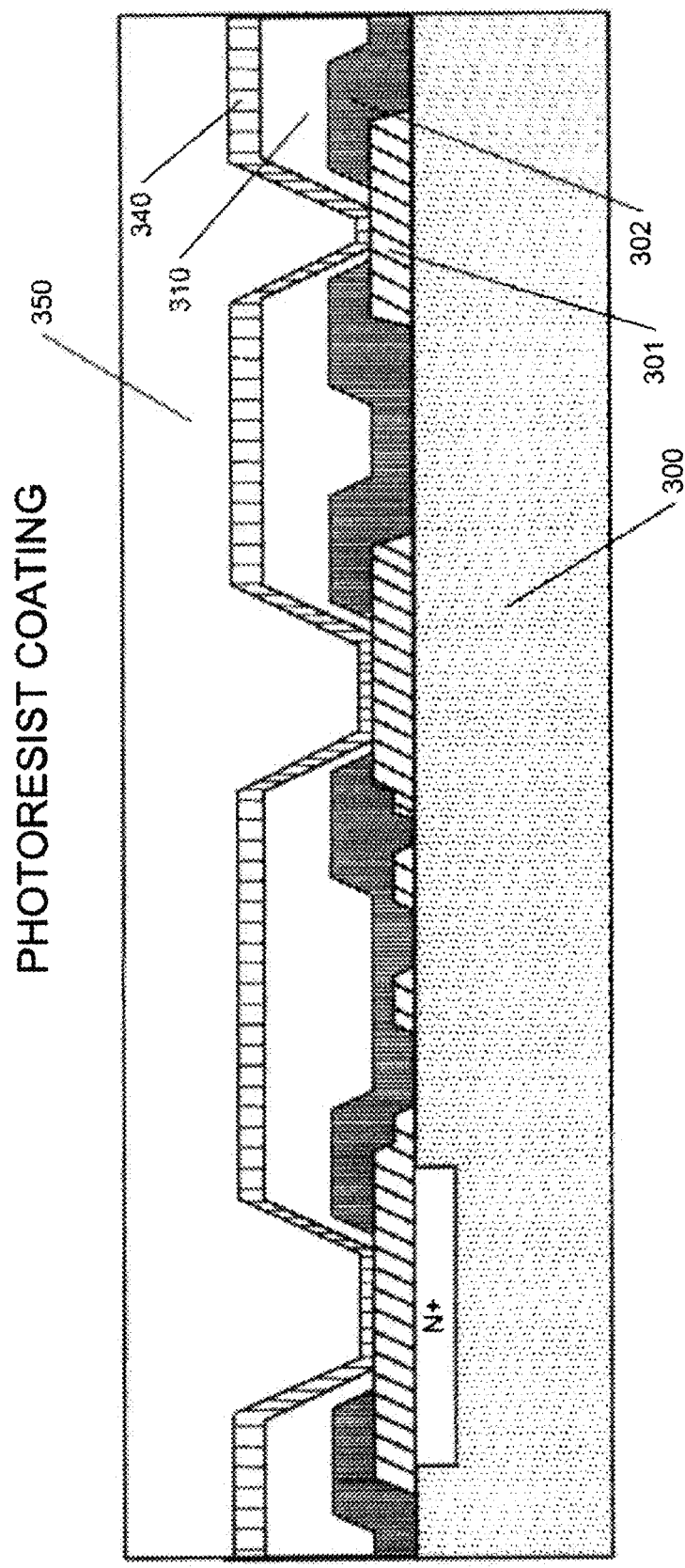
Figure 3G:
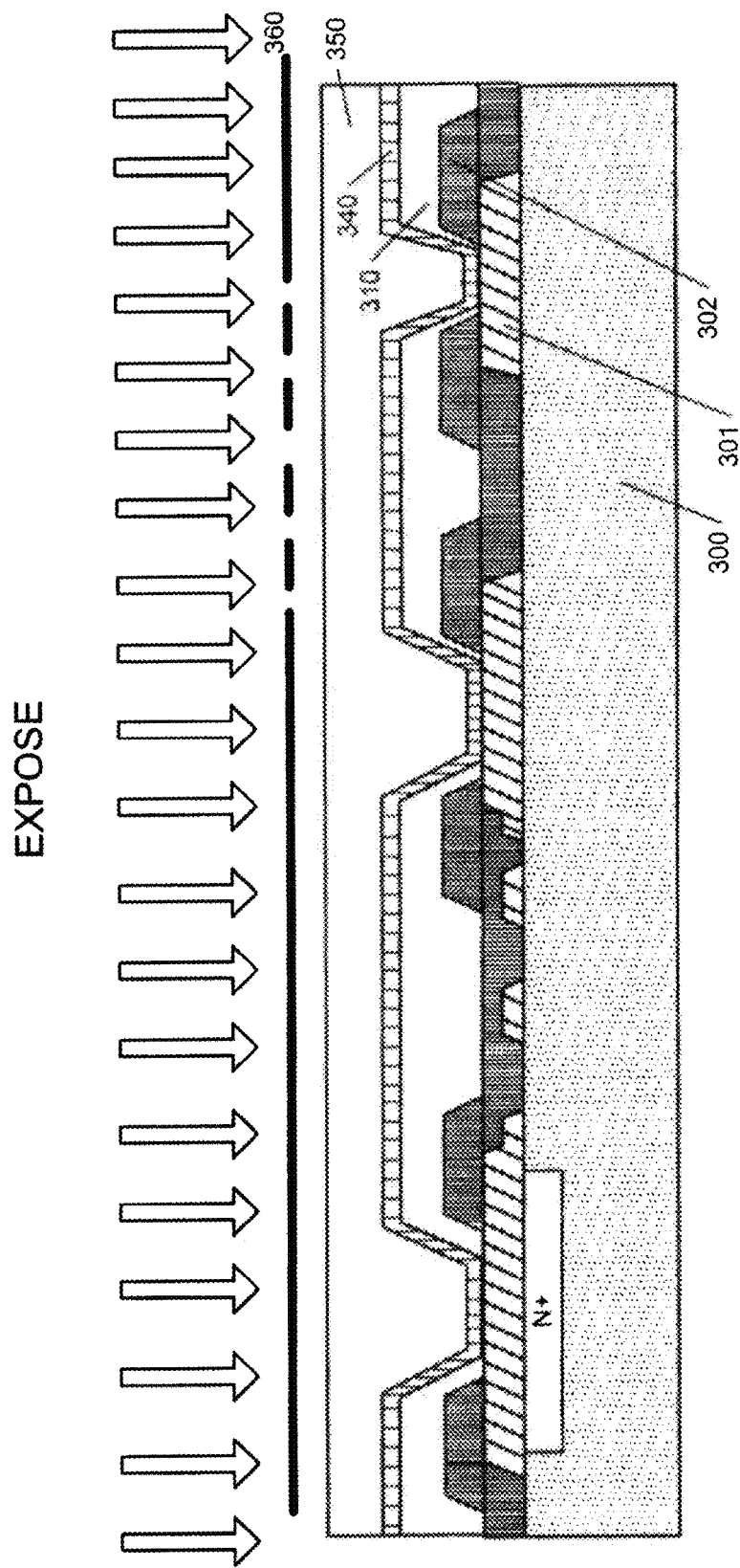
Figure 3H:
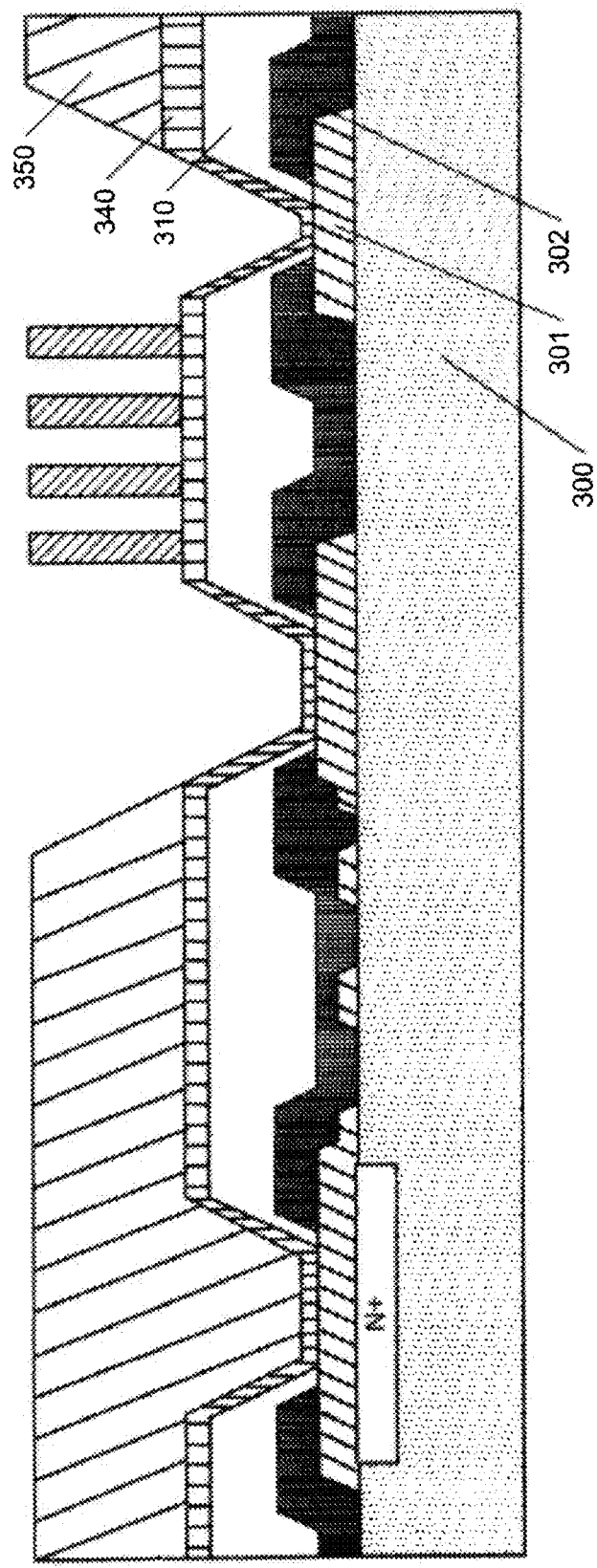
Figure 3I:
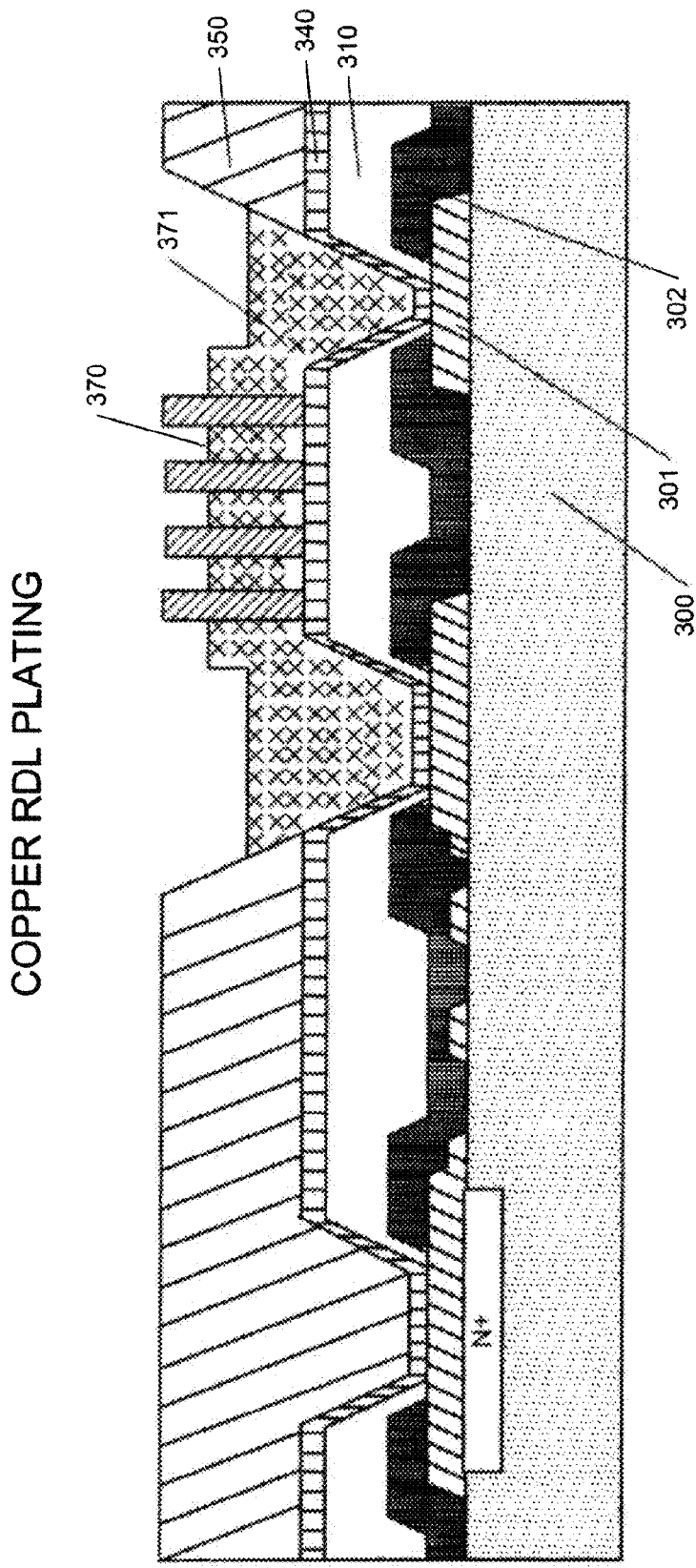
Figure 3J:
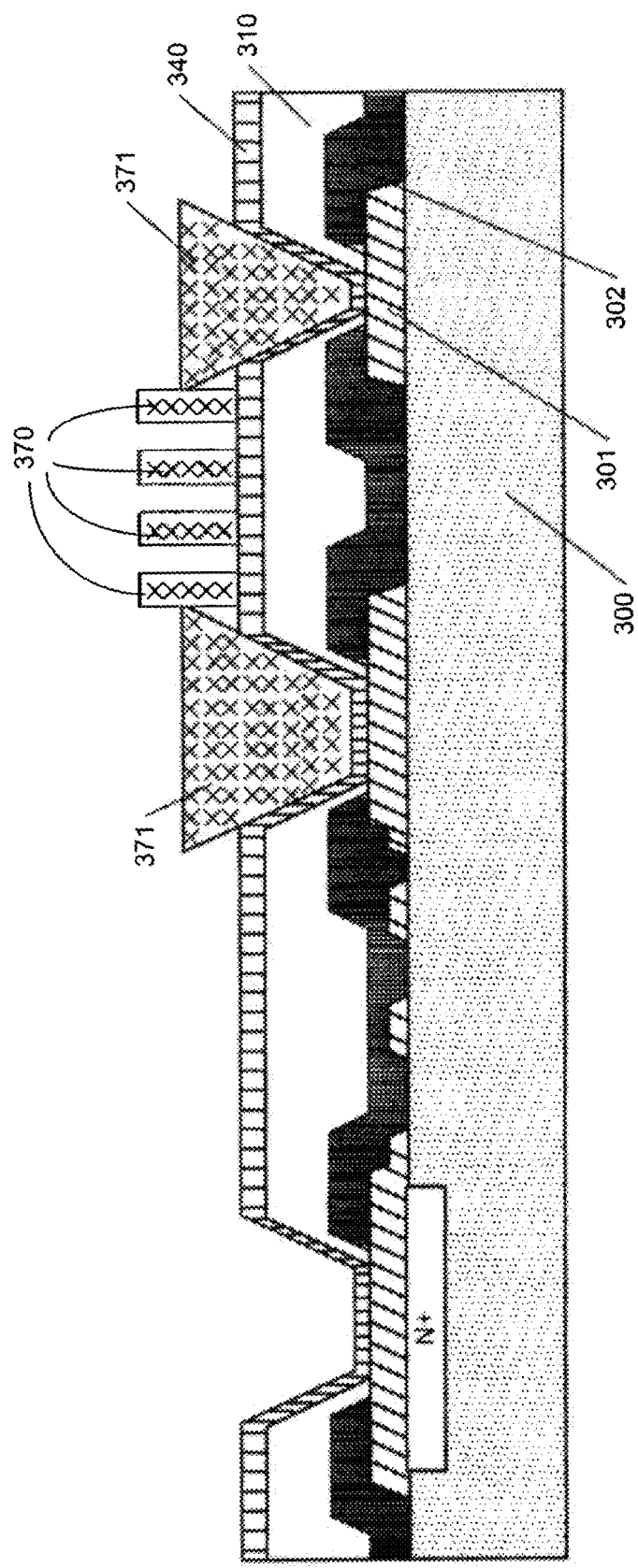
Figure 3K:
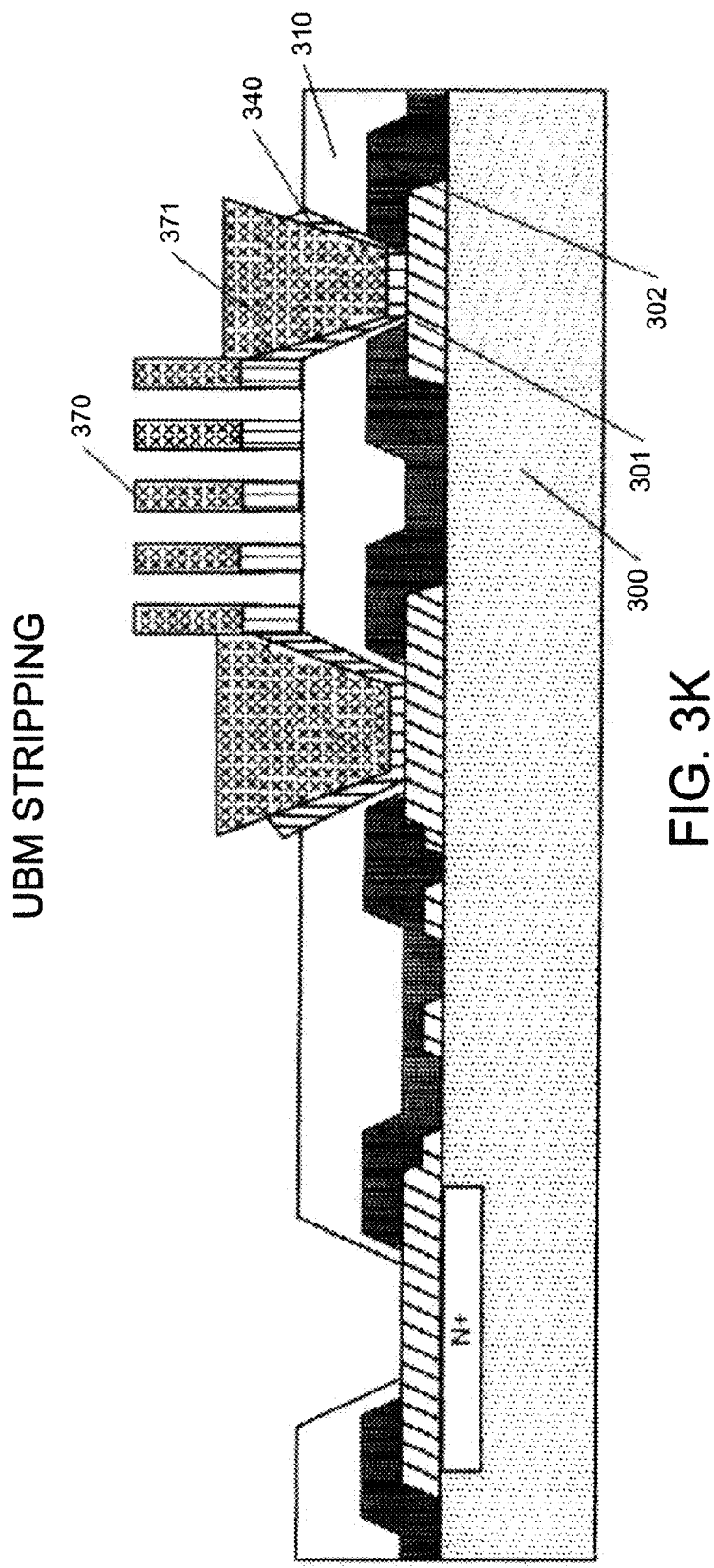
Figure 3L:
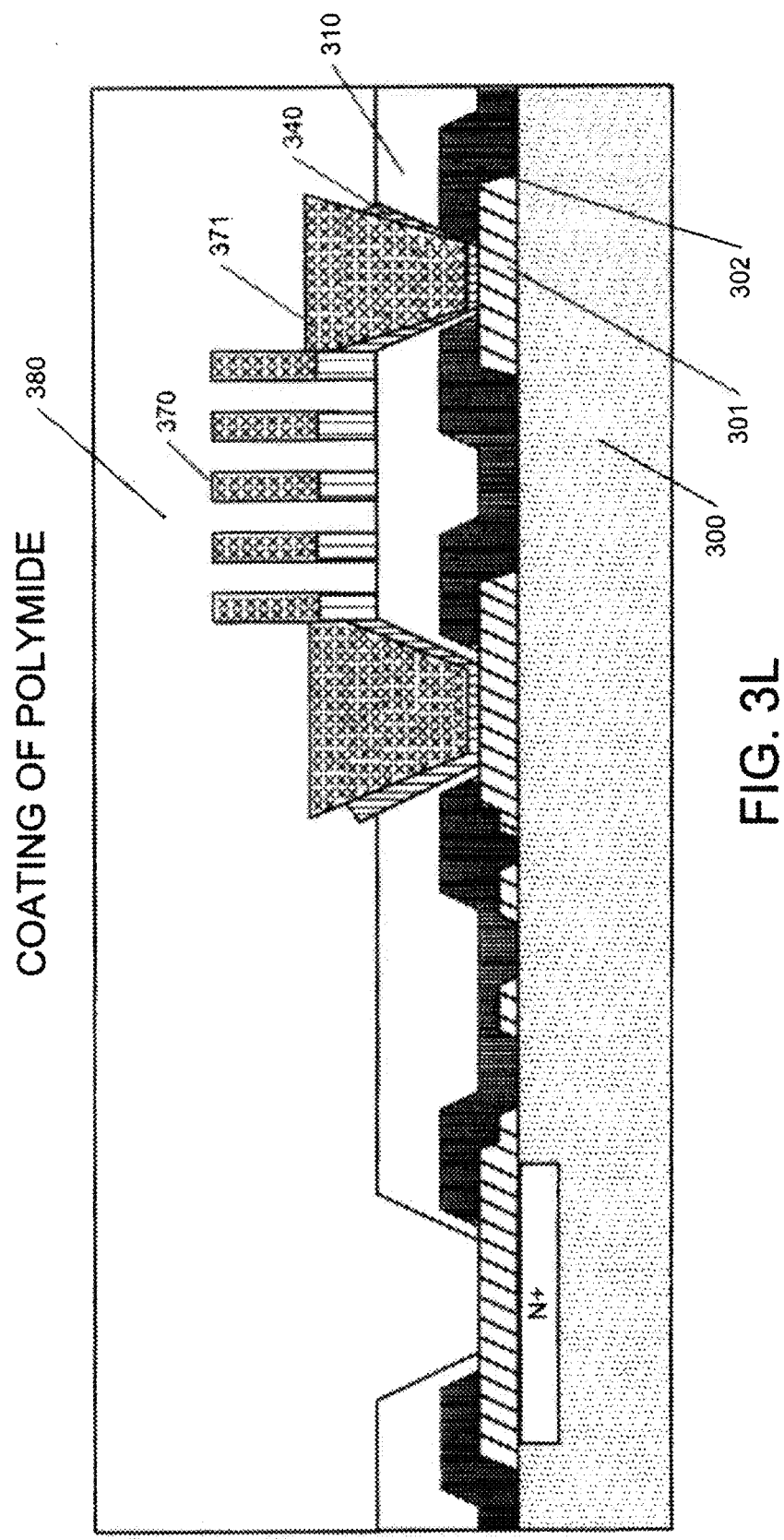
Figure 3M:
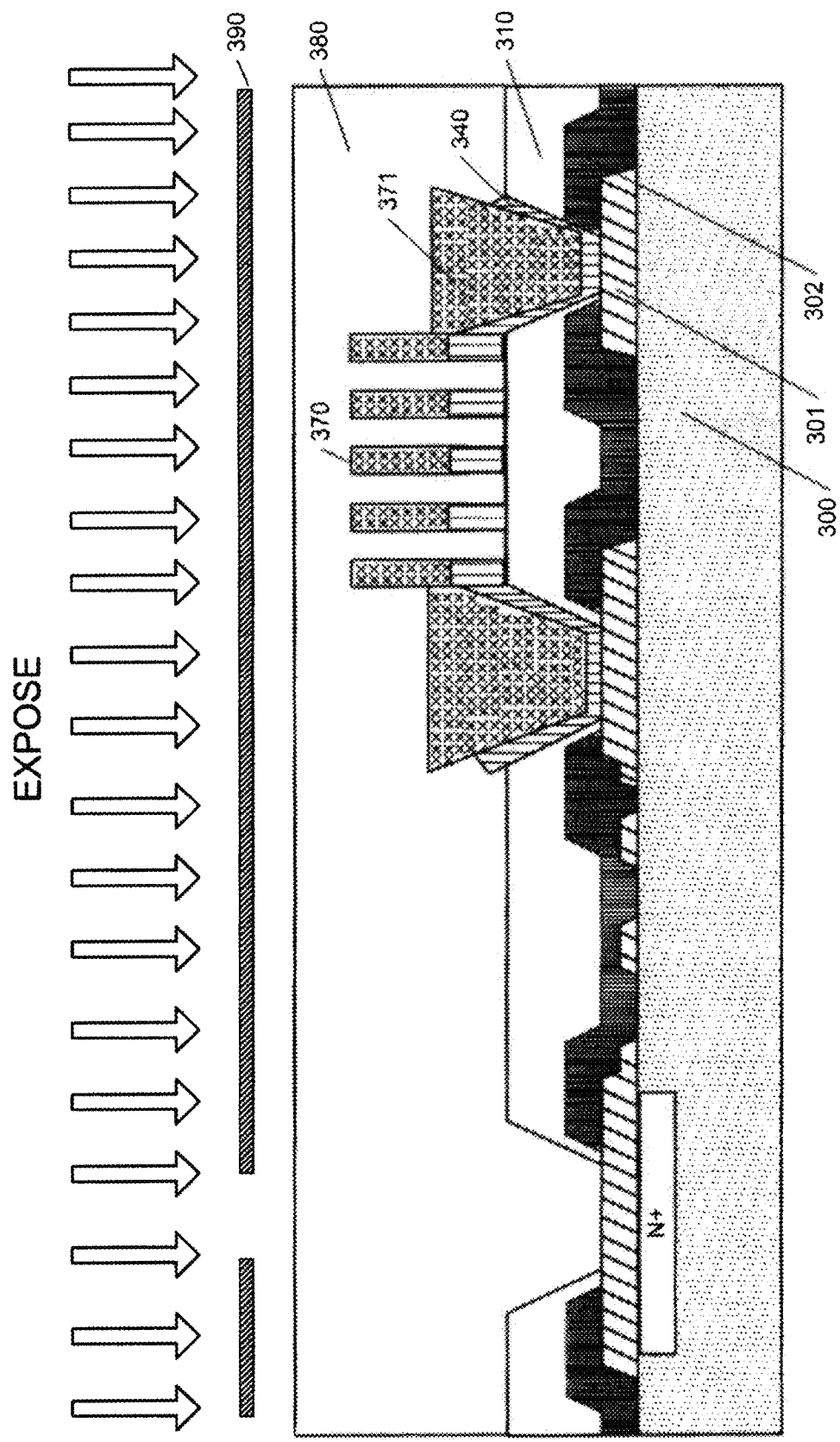
Figure 3N:
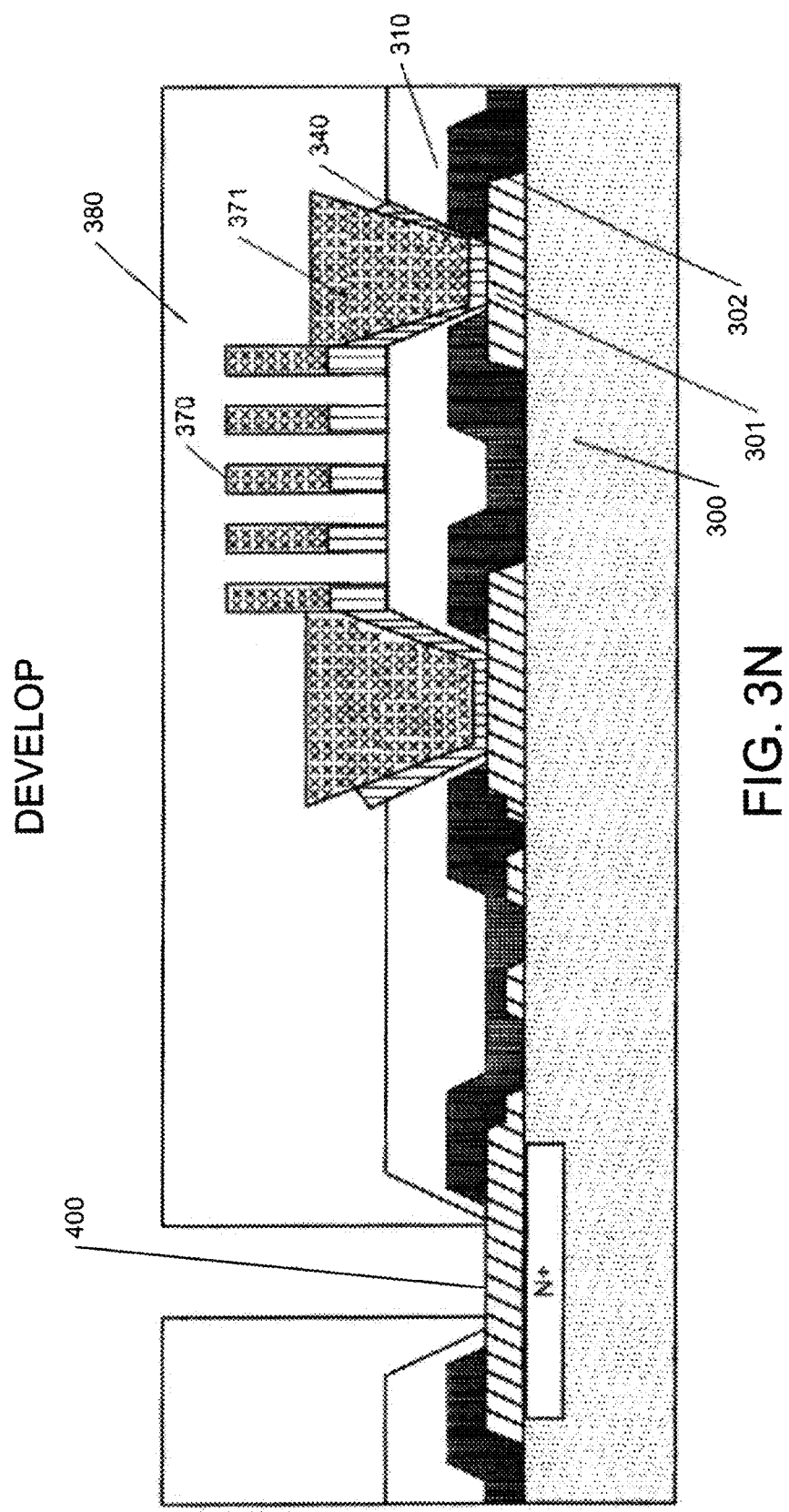

FIGS. 3A-3N show the processing steps of the present invention. These figures show how the aluminum wire bond pads and the copper redistribution lines are formed. FIG. 3A shows a semiconductor wafer at the beginning of the process.

The semiconductor wafer is typically comprised of a semiconductor substrate [300], a layer of aluminum in the middle [301] and a protective, insulating layer [302] on top. The semiconductor substrate will typically be made of silicon and will contain the complete circuitry for an integrated circuit. The protective layer can be made of low temperature silicon oxide, preferably with a thickness in excess of 10,000 angstroms. This protective layer typically is also the passivation layer and will be used for the purpose of protecting the circuitry in the substrate layer below. It is understood that the semiconductor wafer is essentially completed such that it fully defines the integrated circuit for its intended function, including intended external and internal wire bond pad openings [303].

FIG. 3B displays an intermediate step in the process in which the first layer of polyimide coating is deposited onto the completed wafer of FIG. 3A for the purpose of forming a dielectric layer [310]. This dielectric layer will usually range from 3 micrometers to 12 micrometers in thickness. In other embodiments, other dialectic material with similar properties and electrical characteristics can be applied such as BCB or epoxy material with and without filler contents. Other organic materials with or without filler contents can also be used.

FIG. 3C shows a mask [320] being applied over the intermediate structure of FIG. 3B for the purpose of defining the pattern of openings in the polyimide layer. The resulting structure is then exposed to ultraviolet light.

Thereafter, in FIG. 3D, the structure is developed using known photolithographic and etching processes such that the mask is removed completely and such that certain areas of the polyimide are removed to expose distinct contact areas [330] [331] [332].

In FIG. 3E, a thin metal adhesion layer [340] is deposited over the etched first polyimide layer. Preferably, a sputtering method is used to spread a thin layer of UBM (under bump metallization), which is typically comprised of titanium, titanium tungsten, chromium, copper, or nickel. The thickness of this layer will approximately range from a few hundred angstroms to a few thousand angstroms.

In FIG. 3F, a layer of photo resist coating is deposited onto the top surface of the thin metal layer, forming a photo resist layer[350].

In FIG. 3G, a mask [360] is applied on top of the photo resist layer. Known photolithographic and etching processes are then applied to the resulting structure to define openings in the photo resist.

In FIG. 3H, the mask is removed, and the appropriate areas of the photo resist are removed to expose distinct openings in the photo resist for the inductors and redistribution lines.

In FIG. 3I, the inductor and redistribution openings in the photo resist layer are filled to preferably five to nine microns in height and five to nine microns in width with a mixture composed of copper. The resulting structure in this embodiment has a copper redistribution line [370] and a copper inductor [371]. The copper inductor can provide impedance in the range of 3 nanohenries to 50 nanohenries. In other embodiments with more than one inductor, the range of impedance will change depending on the implementation.

In FIG. 3J, the photo resist layer is completely removed using known solvent processes. The solvents used are typically composed of a polycarbon chain.

In FIG. 3K, all exposed parts of the metal adhesion layer are removed using known stripping processes. The strippers used in this process are typically acid/alkaline based or halide salt solutions or peroxide solutions or any of the combinations thereof.

In FIG. 3L, a second layer of polyimide [380] is deposited onto the intermediate structure of FIG. 3K. Typically, the thickness of the second polyimide layer should be thicker than the inductor, and redistribution line, such that the second polyimide layer completely covers the inductor and redistribution layer. In other embodiments, other materials with similar properties and electrical characteristics to polyimide can be applied.

In FIG. 3M, a mask [390] is applied over the structure and the resulting structure is photolithographically processed and etched such that an external aluminum wire bond pad is exposed.

FIG. 3N shows the result of the etching step where the aluminum wire bond pad is exposed [400]. It is this surface that will form the contact point for further wire bonding processes.

The foregoing process describes the process of making an embodiment of the invention with one external aluminum wire pad opening, and one inductor. The process can be repeated to result in an embodiment with several external wire pad openings and several inductors.

A feature of this invention is that the use of aluminum for the wire bond pads results in a simpler manufacturing process and lowers the cost of manufacturing. Aluminum is a standard assembly feature and requires no type of special handling. Thus, the use of aluminum wire bonds results in a simpler manufacturing process. In addition, the use of aluminum wire bond pads instead of copper wire bond pads lowers the cost of manufacturing.

The use of aluminum wire bond pads instead of copper wire bond pads also results in the prevention of deterioration of the resulting device. Aluminum does not oxide as quickly as copper. Thus, the use of aluminum wire bond pads prevents the deterioration and oxidation of the wire bond pads.

Another feature of this invention is that the resulting embodiment of FIG. 3N can be easily connected using wire bond techniques to an integrated circuit, and implemented in a chip scale package. Thus, the inductors and integrated circuit are placed on the same die which reduces the packing size of the resulting chip. In certain embodiments of the invention, it may be packaged with an integrated circuit to form a filter for Electromagnetic Interference (EMI) for mobile handsets. In mobile devices, this invention has several additional features. One feature is the device can provide ESD protection in the range of +/−15 kilo electron volt (IEC) to +/−30 kilo electron volt (HBM). Another feature of this device is that it can provide filtering in the range of 3 gigahertz to 10 gigahertz.

It is apparent that the above embodiments may be altered in many ways without departing from the scope of the invention. Further, various aspects of a particular embodiment may contain patentably subject matter without regard to other aspects of the same embodiment. Additionally, various aspects of different embodiments can be combined together. Also, those skilled in the art will understand that variations can be made in the number and arrangement of components illustrated in the above diagrams. It is intended that the appended claims include such changes and modifications.

What is claimed is:

1. A semiconductor device comprising:
   a semiconductor substrate having a plurality of electrically connected devices provided thereon;
   a plurality of layers disposed over the semiconductor substrate, including at least one insulating layer, a conducting layer and a top insulating layer provided above the conducting layer, wherein the conducting layer includes aluminum wiring that electrically interconnects at least some of the plurality of electrically connected devices, a plurality of internal wire bond pads and a plurality of external wire bond pads;

a copper redistribution line disposed within an insulating redistribution layer disposed over the top insulating layer, the copper redistribution line interconnecting at least some of the internal wire bond pads;

vertical portions extending from the plurality of external wire bond pads through one or more of the at least one insulating layer and the top insulating layer and through corresponding vertical portions of the insulating redistribution layer, wherein the vertical portions are formed by removal of material from the one or more of the at least one insulating layer, the top insulating layer and the insulating redistribution layer; and conducting material filling each of the vertical portions, the conducting material connecting external wire bond pads to associated external connection lines.

2. The semiconductor device of claim 1, further comprising a copper inductor formed within the insulating redistribution layer.

3. The semiconductor device of claim 1, further comprising an ESD protection device.

4. The semiconductor device of claim 1, further comprising a filtering device.

* * * * *